(12) United States Patent
Hong et al.

(10) Patent No.: US 7,345,876 B2
(45) Date of Patent: Mar. 18, 2008

(54) COMPACT CONVERTER

(75) Inventors: Weibi Hong, Shanghai (CN); Yuancheng Lu, Shanghai (CN)

(73) Assignee: New Focus Lighting and Power Technology (Shanghai) Co., Ltd, Shanghai (CN)

( * ) Notice: Subject to any disclaimer, the term of this patent is extended or adjusted under 35 U.S.C. 154(b) by 89 days.

(21) Appl. No.: 11/297,867

(22) Filed: Dec. 9, 2005

(65) Prior Publication Data
US 2006/0268515 A1   Nov. 30, 2006

(30) Foreign Application Priority Data
May 6, 2005   (CN) .................. 2005 2 0019949

(51) Int. Cl.
*H05K 7/20*   (2006.01)
(52) U.S. Cl. .................. 361/695; 361/687; 361/714; 361/715; 165/80.3; 165/121; 165/122
(58) Field of Classification Search ........ 361/690–695, 361/717–719, 816, 818, 714–718; 165/80.3, 165/121–126; 454/184; 174/35 R, 51, 16.1; 310/67 R, 90, 91, 217, 62, 63, 42, 9, 257, 310/915.6; 312/282, 314, 316, 107, 111, 312/223.2, 223.3
See application file for complete search history.

(56) References Cited

U.S. PATENT DOCUMENTS

| | | | | | |
|---|---|---|---|---|---|
| 5,478,221 | A | * | 12/1995 | Loya | 417/313 |
| 5,502,618 | A | * | 3/1996 | Chiou | 361/695 |
| 6,141,218 | A | * | 10/2000 | Miyahara | 361/695 |
| 6,226,182 | B1 | * | 5/2001 | Maehara | 361/695 |
| 6,654,244 | B2 | * | 11/2003 | Laufer et al. | 361/695 |
| 2006/0104025 | A1 | * | 5/2006 | Wabiszczewicz | 361/694 |
| 2006/0120043 | A1 | * | 6/2006 | Wolford et al. | 361/695 |
| 2006/0198104 | A1 | * | 9/2006 | Chang et al. | 361/695 |

* cited by examiner

*Primary Examiner*—Michael Datskovskiy
(74) *Attorney, Agent, or Firm*—Raymond Y. Chan; David and Raymond Patent Firm

(57) ABSTRACT

The present invention discloses a compact converter including a compact casing having an air inlet defined thereon, a printed circuit board supported within the compact casing at a position between a top and a bottom wall of the compact casing to form an upper air channel between the printed circuit board and the top wall of the compact casing and a lower air channel between the printed circuit board and the bottom wall of the compact casing, wherein the lower air channel is communicating with the upper channel; a cooling fan is electrically mounted on the printed circuit board at a position aligning with the air inlet for drawing exterior air through the air inlet to the lower air channel to create an air circulation between the lower air channel and the upper air channel, so as to cool down the printed circuit board.

12 Claims, 1 Drawing Sheet

COMPACT CONVERTER

BACKGROUND OF THE PRESENT INVENTION

1. Field of Invention

The present invention relates to an electrical device, and more particularly, relates to a mini-sized ultra-thin converter for substantially reducing a size of the electrical device.

2. Description of Related Arts

Commonly, the field-effect devices and the transformers would generate enormous heat during operations. To effectively dissipate the heat, a powerful converter would be prepared with a bulky size casing in practices, wherein a fan is received within the casing for generating an air flow from one side to another side. In most cases, the air flow generated by the fan is blowing along only one surface of the printed circuit board. The heat dissipating efficiency of the converter is low. Furthermore, the fan is perpendicularly mounted within the casing with respect to the printed circuit board. As a result, the thickness of the casing must be correspondingly increased to cover the height of the fan, thus wasting extra inner space of the casing. Undesirably, the converter prepared with such structure is inevitably thick and bulky, which is not suitable for current compact electrical devices. It is foreseeable that an exquisite and delicate converter will be demandable and welcomed in the market.

SUMMARY OF THE PRESENT INVENTION

A primary object of the present invention is to provide an ultra-thin compact converter, which is capable of effectively dissipating the heat generated from the electrical elements of the converter, while maintaining the inherent functions of conventional converter unaltered.

Another object of the present invention is to provide an ultra-thin compact converter, wherein the air flow generated from a fan received in the converter is arranged to flow along both sides of a printed circuit board of the converter so as to effectively dissipate the heat of the converter.

Another object of the present invention is to provide an ultra-thin compact converter, wherein no complicated structure or expensive components are required to achieve the above mentioned objects.

Accordingly, to achieve the above me

Accordingly, to achieve the above mentioned projects, the present invention provides a compact converter, comprising:

a compact casing having an air inlet and comprising a bottom wall and a top wall;

a printed circuit board supported within the compact casing at a position between the top and bottom walls thereof to form an upper air channel between the printed circuit board and the top wall of the compact casing and a lower air channel between the printed circuit board and the bottom wall of the compact casing, wherein the lower air channel is communicating with the upper channel; and a cooling fan electrically mounted on the printed circuit board at a position aligning with the air inlet for drawing exterior air through the air inlet to the lower air channel to create an air circulation between the lower air channel and the upper air channel, so as to cool down the printed circuit board.

These and other objectives, features, and advantages of the present invention will become apparent from the following detailed description, the accompanying drawings, and the appended claims.

DETAILED DESCRIPTION OF THE PREFERRED EMBODIMENT

Figure 1:
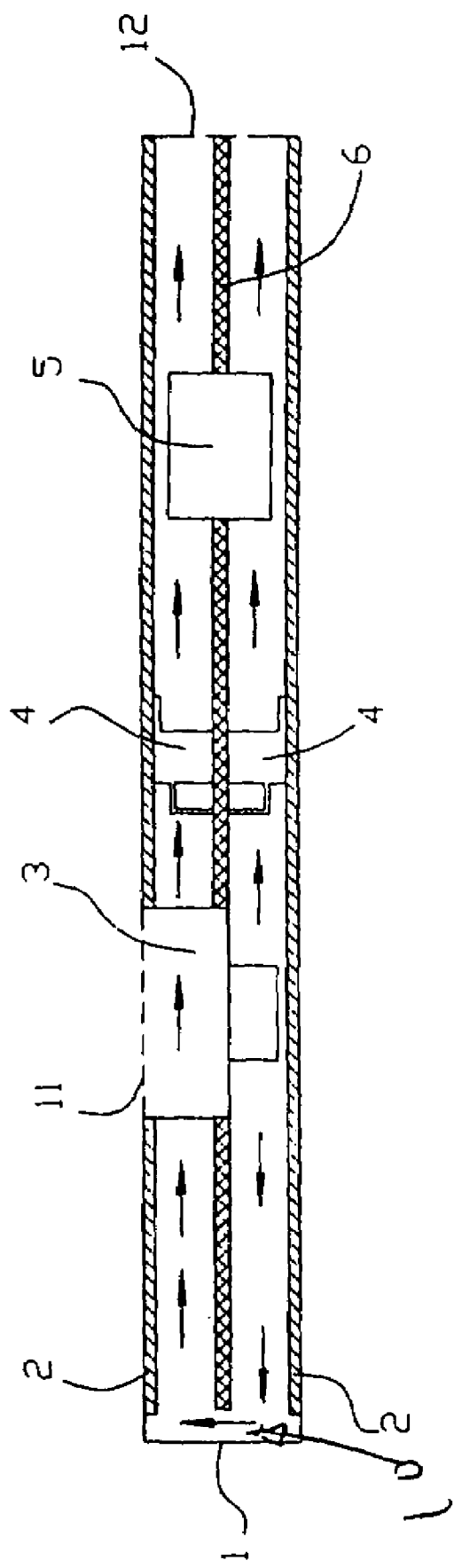
FIG. 1 is a schematic view of a compact converter according to a preferred embodiment of the present invention.

Referring to FIG. 1, a compact converter according to a preferred embodiment of the present invention is illustrated. The compact converter comprises a casing 1, a printed circuit board 6 received in the casing 1, a pair of heat dissipating member 2 respectively provided at top and bottom wall of the casing 1, and a convert circuit arranged at either surface of the printed circuit board 6, wherein the converter circuit comprises a power source input (not shown in FIG. 1), an over-current protection device (not shown in FIG. 1), a cooling fan 3, an input filter device (not shown in FIG. 1), a pair of power switches 4, a control circuit (not shown in FIG. 1), a transformer 5, a high voltage rectify filter device (not shown in FIG. 1), a high voltage electrical switch (not shown in FIG. 1), and an output connector. According to the preferred embodiment of the present invention, the compact converter has an air inlet 11 provided on a top wall of the casing 1 at a position correspondingly align with the cooling fan 3 and an air outlet 12 provided at a side wall of the casing 1. Preferably, there is an air communication channel 10 defined between the printed circuit board 6 and the casing 1 at a position opposite to the air outlet 12. It is noted that the printed circuit board 6 has a plurality of through-carved openings arranged thereon for correspondingly accommodating the transformer 5 and the cooling fan 3, wherein the cooling fan 3 is flatly received within one of such opening with respect to the printed circuit board 6. Two power switches 4 are respectively provided at either side of the printed circuit board 20 at a position adjacent to the heat dissipating members 2. When the converter was powered on, the power switches 4 would generate heat, and simultaneously, the cooling fan 3 would be enabled to suck air from the air inlet 11. Due to the fact that the cooling fan 3 is flatly embedded within the printed circuit board 6, the axis of the cooling fan 3 is perpendicular with respect to the printed circuit board 6. The air sucked into the interior of the casing 1 would be directly sucked into the lower portion of the casing I and divided into two airstreams flowing along the bottom surface of the printed circuit board 6, namely, a left air stream and a right air stream. As shown in FIG. 1, the right air stream is capable of draining off the heat dissipated from the lower heating dissipating member 2 so as to cool down the lower power switch 4 and exhausting such heat from the air outlet 12. On the other hand, the left air stream is detoured bypass the air communication channel 10 defined between the casing 1 and the printed circuit board 6 to drain off the heat dissipated from the upper dissipating member 2 via the air outlet 12 so as to cool down the upper power switch 4. It is worth to mention the two separated airstreams would cool-off the transformer 5 as well as other heating elements arranged at two surfaces of the printed circuit board 6.

In other words, the compact converter comprises a compact casing 1 which has an air inlet 11 and comprises a bottom wall and a top wall, a printed circuit board 6 supported within the compact casing 1 at a position between the top and bottom walls thereof to form an upper air channel between the printed circuit board 6 and the top wall of the compact casing and a lower air channel between the printed circuit board 6 and the bottom wall of the compact casing 1, wherein the lower air channel is communicating with the upper channel. Moreover, the compact converter further comprises a cooling fan 3 electrically mounted on the printed circuit board 6 at a position aligning with the air inlet 11 for drawing exterior air through the air inlet 11 to the lower air channel so as to generate an air circulation between the lower air channel and the upper air channel for ultimately cooling down the printed circuit board 6.

Preferably, the cooling fan 3 is supported on the printed circuit board 6 at a position within the upper air channel for facilitating the exterior air directly sucked into the lower air channel. Accordingly, the compact casing 1 has a side surrounding wall extended between the top and bottom walls to form an air communication channel between the peripheral edge of the printed circuit board 6 and the side surrounding wall for allowing the exterior air sucked by the cooling fan 3 to pass from the lower air channel to the upper air channel through the air communication channel.

As shown in FIG. 1, the printed circuit board 6 is loosely received in the casing 1 for automatically divided the compacting casing 1 into the upper air channel and the lower air channel. Moreover, there is a gap defined between the peripheral edge of the printed circuit board 6 and the compact casing 1 so as to form the air communication channel 10 for communicating the upper air channel and the lower air channel. That is to say, the printed circuit board is not arranged to continuously extend for air tightly separating the compact casing, instead, for purposely leaving a communicating slot for communicating the upper air channel and the lower air channel. And reasonably, the air outlet 12 is formed on the side surrounding wall for allowing the exterior air sucked into the compact casing 1 discharged from the air outlet after the printed circuit board 6 is cooled down.

In the present invention, the heat dissipating members 2 could be applied as two heat dissipating walls spacedly extended from the printed circuit board 6 and are supported within the upper and lower air channels respectively, wherein the two dissipating walls are adapted for transmitting heat from the printed circuit board 6 and being cooled down by the exterior air sucked into the compact casing 1.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure form such principles. Therefore, this invention includes all modifications encompassed within the spirit and scope of the following claims.

What is claimed is:

1. A compact converter, comprising:

a compact casing having an air inlet and an air outlet, and comprising a bottom wall, a top wall and a side wall extended between said bottom wall and said top wall and defines a first and a second end portions of said compact casing, wherein said air inlet is formed on a middle portion of said top wall and said air outlet is formed on said side wall at said first end portion of said compact casing;

a printed circuit board supported within said compact casing at a position between said top and bottom walls thereof to form an upper air channel between said printed circuit board and said top wall of said compact casing and a lower air channel between said printed circuit board and said bottom wall of said compact casing, wherein said lower air channel is communicating with said upper channel via an air communication channel which is formed at a position opposed to said air outlet on said side wall at said second end portion of said compact casing;

two heat dissipating elements which are spacedly extended from said printed circuit board and are longitudinally supported along said upper and lower air channels respectively, wherein said two dissipating elements are adapted for transmitting heat from said printed circuit board; and a cooling fan electrically mounted on said printed circuit board at a position aligning with said air inlet for drawing exterior air through said air inlet to said lower air channel to create a first and a second air circulation path of said exterior air, wherein said first circulation path extends from said cooling fan to said air outlet at said lower air channel so as to allow said exterior air flowing into said first air circulation path to flow from said cooling fan to said air outlet in said lower air channel along a bottom side of said printed circuit board and one of said corresponding heat dissipating element, and said second air circulation path extends from said cooling fan to said air communication channel opposed to said air outlet in said lower air channel, and from said air communication channel to said air outlet such that said exterior air flowing through said second air circulation path is blown to flow from said cooling fan to said air communication channel in said lower air channel and then from said air communication channel to said air outlet in said upper air channel along an upper side of said printed circuit board and another of said corresponding heat dissipating element, such that said first and said second air circulation path is adapted to maximize a distance over which said heat is dissipated within a very confined space of said compact casing, and create a double cooling effect to said upper and said bottom side of said printed circuit board through dissipating heat by said heat dissipating elements and convection through said air outlet for maximizing an effectiveness and efficiency of heat dissipation within said compact casing.

2. The compact converter, as recited in claim 1, wherein said cooling fan is supported on said printed circuit board at a position within said upper air channel.

3. The compact converter, as recited in claim 1, wherein said printed circuit board comprises two power switches mounted within said compact casing to electrically connect with said printed circuit board, wherein said power switches are opposedly extended in said upper air channel and said lower air channel to contact with said two heat dissipating elements respectively, so that said heat generated by said power switches is adapted to be effectively dissipated to an exterior of said compact casing through said heat dissipating elements and said air flow in said first and said second air circulation path.

4. The compact converter, as recited in claim 2, wherein said printed circuit board comprises two power switches mounted within said compact casing to electrically connect with said printed circuit board, wherein said power switches are opposedly extended in said upper air channel and said lower air channel to contact with said two heat dissipating elements respectively, so that said heat generated by said power switches is adapted to be effectively dissipated to an exterior of said compact casing through said heat dissipating elements and said air flow in said first and said second air circulation path.

5. The compact converter, as recited in claim 1, wherein said two dissipating elements, each having a flat and elongated structure, are longitudinally mounted on said top and bottom walls of said compact casing at a position within said upper and lower air channels respectively.

6. The compact converter, as recited in claim 2, wherein said two dissipating elements, each having a flat and elongated structure, are longitudinally mounted on said top and bottom walls of said compact casing at a position within said upper and lower air channels respectively.

7. The compact converter, as recited in claim 3, wherein said two dissipating elements, each having a flat and elongated structure, are longitudinally mounted on said top and bottom walls of said compact casing at a position within said upper and lower air channels respectively.

8. The compact converter, as recited in claim 4, wherein said two dissipating elements, each having a flat and elongated structure, are longitudinally mounted on said top and bottom walls of said compact casing at a position within said upper and lower air channels respectively.

9. The compact converter, as recited in claim 5, wherein said printed circuit board further comprises a transformer supported thereon across said upper and said lower air channel such that said transformer is adapted for being effectively cooled down when said exterior air passes through said upper and lower air channels via said first and said second air circulation path.

10. The compact converter, as recited in claim 6, wherein said printed circuit board further comprises a transformer supported thereon across said upper and said lower air channel such that said transformer is adapted for being effectively cooled down when said exterior air passes through said upper and lower air channels via said first and said second air circulation path.

11. The compact converter, as recited in claim 7, wherein said printed circuit board further comprises a transformer supported thereon across said upper and said lower air channel such that said transformer is adapted for being effectively cooled down when said exterior air passes through said upper and lower air channels via said first and said second air circulation path.

12. The compact converter, as recited in claim 8, wherein said printed circuit board further comprises a transformer supported thereon across said upper and said lower air channel such that said transformer is adapted for being effectively cooled down when said exterior air passes through said upper and lower air channels via said first and said second air circulation path.

\* \* \* \* \*